United States Patent
Su

(10) Patent No.: US 8,928,504 B2
(45) Date of Patent: Jan. 6, 2015

(54) MULTIPLYING ANALOG-TO-DIGITAL CONVERTER AND PIPELINE ANALOG-TO-DIGITAL CONVERTER USING THE SAME

(71) Applicant: Novatek Microelectronics Corp., Hsinchu (TW)

(72) Inventor: Tung-Ming Su, Zhubei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/759,365

(22) Filed: Feb. 5, 2013

(65) Prior Publication Data

US 2013/0321185 A1 Dec. 5, 2013

(30) Foreign Application Priority Data

May 30, 2012 (TW) .............................. 101119342 A

(51) Int. Cl.
| | |
|---|---|
| *H03M 1/00* | (2006.01) |
| *H03M 1/12* | (2006.01) |
| *H03M 1/10* | (2006.01) |
| *H03M 1/06* | (2006.01) |
| *H03M 1/44* | (2006.01) |

(52) U.S. Cl.
CPC .............. *H03M 1/009* (2013.01); *H03M 1/124* (2013.01); *H03M 1/1014* (2013.01); *H03M 1/0695* (2013.01); *H03M 1/44* (2013.01)
USPC ............ 341/110; 341/161; 341/155; 341/172

(58) Field of Classification Search
CPC ...................................................... H03M 1/00

USPC .......................... 341/110, 155, 156, 172, 161
See application file for complete search history.

(56) References Cited

U.S. PATENT DOCUMENTS

| | | | | |
|---|---|---|---|---|
| 5,206,647 | A * | 4/1993 | Stone ............................ | 341/139 |
| 7,450,050 | B2 * | 11/2008 | Rezayee et al. ............... | 341/161 |
| 2004/0100397 | A1 * | 5/2004 | Abdelatty Ali ............... | 341/118 |
| 2007/0247348 | A1 * | 10/2007 | Rezayee et al. ............... | 341/161 |
| 2009/0015455 | A1 * | 1/2009 | Oshima et al. ................ | 341/172 |
| 2009/0040089 | A1 * | 2/2009 | Dosho et al. .................. | 341/161 |

OTHER PUBLICATIONS

Devarajan et al., "A 16-bit, 125 MS/s, 385 mW, 78.7 dB SNR CMOS Pipeline ADC", IEEE Journal of Solid-State Circuits, vol. 44, No. 12, Dec. 2009.

(Continued)

*Primary Examiner* — Jean B Jeanglaude
(74) *Attorney, Agent, or Firm* — Rabin & Berdo, P.C.

(57) ABSTRACT

A multiplying analog-to-digital converter is provided. A sample-and-hold unit samples an analog signal, to obtain a sample level. A analog-to-digital converting unit converts the analog signal to a digital signal. A digital-to-analog converting unit converts the digital signal to a recovered signal level. A operating unit provides an output signal according to the difference between the sample level and the recovered signal level. A comparator compares a level of the output signal with an upper threshold level and a lower threshold level, and accordingly provides an indicating signal, wherein the upper and lower threshold levels define a predetermined level range. When the indicating signal indicates that the level of the output signal is outside the predetermined level range, a controller shifts a value of the digital signal and accordingly provides an adjusted digital signal.

19 Claims, 8 Drawing Sheets

(56) References Cited

OTHER PUBLICATIONS

Lee et al., "A 10-bit 50 MS/s Pipelined ADC With Capacitor-Sharing and Variable-gm Opamp", IEEE Journal of Solid-State Circuits, vol. 44, No. 3, Mar. 2009.

Mehr et al., "A 55-mW, 10-bit, 40-Msample/s Nyquist-Rate CMOS ADC", IEEE Journal of Solid-State Circuits. vol. 35, No. 3, Mar. 2000.

Huang et al., "SHA-Less Pipelined ADC With in Situ Background Clock-Skew Calibration", IEEE Journal of Solid-State Circuits, vol. 46, No. 8, Aug. 2011.

\* cited by examiner

| S_lead | S_lag | Dd0_MSB | Dd0_LSB | Dd0'_MSB | Dd0'_LSB |
|---|---|---|---|---|---|
| 0 | 0 | 1 | 1 | 1 | 1 |
| 0 | 0 | 0 | 1 | 0 | |
| 0 | 0 | 0 | 0 | 0 | 0 |
| 1 | 0 | 1 | 1 | 1 | 1 |
| 1 | 0 | 0 | 1 | 1 | 1 |
| 1 | 0 | 0 | 0 | 0 | 1 |
| 0 | 1 | 1 | 1 | 0 | 1 |
| 0 | 1 | 0 | 1 | 0 | 0 |
| 0 | 1 | 0 | 0 | 0 | 0 |

MULTIPLYING ANALOG-TO-DIGITAL CONVERTER AND PIPELINE ANALOG-TO-DIGITAL CONVERTER USING THE SAME

This application claims the benefit of Taiwan application Serial No. 101119342, filed May 30, 2012, the subject matter of which is incorporated herein by reference.

BACKGROUND OF THE INVENTION

1. Field of the Invention

The invention relates in general to a multiplying analog-to-digital converter, and more particularly to a multiplying analog-to-digital converter without using a sample-and-hold circuit.

2. Description of the Related Art

With the rapid advance in technology, the pipeline analog-to-digital converter has been provided and widely used in various fields such as wireless transmission circuits and consumer digital electronic products. In general, the multi-bit pipeline analog-to-digital converter includes a pre-stage sample-and-hold circuit and at least one stage of multiplying analog-to-digital converter. The pre-stage sample-and-hold circuit samples an inputted analog signal to obtain a sample signal. The at least one stage of multiplying analog-to-digital converter coverts the sample signal to obtain a corresponding digital signal.

For the existing pipeline analog-to-digital converters, the pre-stage sample-and-hold circuit is realized by a capacitor having large capacitance and a power-consuming operation amplifier. Consequently, existing pipeline analog-to-digital converters have the problems of power consumption being too high and circuit area being too large. Therefore, how to provide suitable circuit design of pipeline analog-to-digital converter to resolve the above-mentioned problems has become a prominent task for the industries.

SUMMARY OF THE INVENTION

According to a first aspect of the present invention, a multiplying analog-to-digital converter including a sample-and-hold unit, an analog-to-digital converting unit, a digital-to-analog converting unit, an operating unit, a comparator and a controller is provided. The sample-and-hold unit samples an analog signal to obtain a sample level. The analog-to-digital converting unit converts the analog signal to a digital signal whose value ranges between a minimum and a maximum. The digital-to-analog converting unit converts the digital signal to a recovered signal level. The operating unit generates an output signal according to the difference between the sample level and the recovered signal level. The comparator compares a level of the output signal with an upper threshold level with a lower threshold level, and provides an indicating signal representing the comparison result. The upper and lower threshold levels define a predetermined level range. When the indicating signal indicates that the level of the output signal is outside the predetermined level range, the controller shifts a value of the digital signal and accordingly provides an adjusted digital signal.

According to a second aspect of the present invention, a multiplying analog-to-digital converter including an analog-to-digital converting unit, a switch capacitor circuit, a comparator and a controller is provided. The analog-to-digital converting unit converts the analog signal to a digital signal whose value ranges between a minimum and a maximum. The switch capacitor circuit generates an output signal according to the analog signal and the digital signal. The comparator compares a level of the output signal with an upper threshold level and a lower threshold level, and provides an indicating signal representing the comparison result, wherein the upper and lower threshold levels define a predetermined level range. When the indicating signal indicates that the level of the output signal is outside the predetermined level range, the controller shifts a value of the digital signal and accordingly provides an adjusted digital signal.

According to a third aspect of the present invention, a pipeline analog-to-digital converter including a multiplying analog-to-digital converter disclosed in the first aspect and one or more post-stage multiplying analog-to-digital converters is provided. The one or more post-stage multiplying analog-to-digital converters provide a second digital signal according to the output signal.

According to a fourth aspect of the present invention, a pipeline analog-to-digital converter including a multiplying analog-to-digital converter disclosed in the second aspect and one or more post-stage multiplying analog-to-digital converters is provided. The one or more post-stage multiplying analog-to-digital converters provides a second digital signal according to the output signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
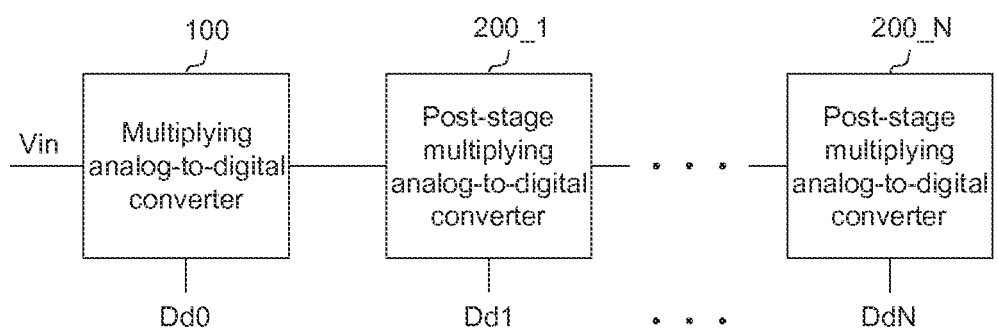
FIG. 1 shows a block diagram of a pipeline analog-to-digital converter according to an embodiment of the invention.

Referring to FIG. 1, a block diagram of a pipeline analog-to-digital converter according to an embodiment of the invention is shown. The pipeline analog-to-digital converter 1 of the present embodiment converts an analog signal Vin to obtain M-bit digital data Dd, wherein M is a natural number larger than 1. For example, the pipeline analog-to-digital converter 1 includes a multiplying analog-to-digital converter 100 and N post-stage multiplying analog-to-digital converters 200_1~200_N, wherein N is a natural number. The multiplying analog-to-digital converter 100 is serially connected to the N post-stage multiplying analog-to-digital converters 200_1~200_N.

Detailed descriptions of the multiplying analog-to-digital converter 100 and the post-stage multiplying analog-to-digital converters 200_1~200_N are disclosed below.

Figure 2:
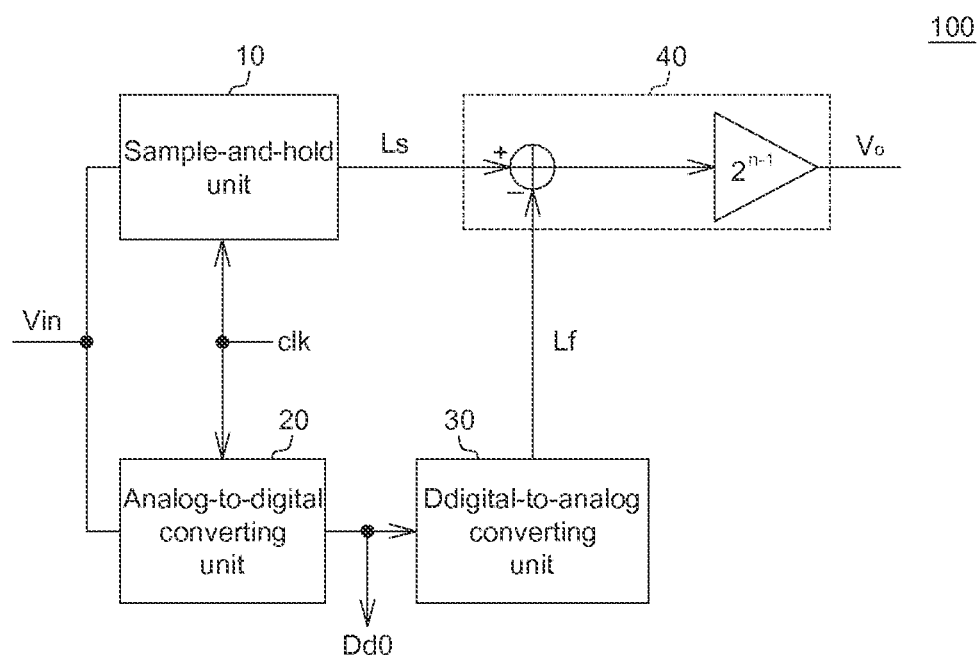
FIG. 2 shows a detailed block diagram of a multiplying analog-to-digital converter according to a first embodiment of the invention.

First Embodiment:

Referring to FIG. 2, a detailed block diagram of a multiplying analog-to-digital converter 100 according to a first embodiment of the invention is shown. In an example, the multiplying analog-to-digital converter 100 is a 1.5-bit analog-to-digital converter, for converting an analog signal Vin to obtain a digital signal (hereinafter the value of the digital signal is referred to as digital value Dd0), indicating the values of the first 1.5 bits of the digital data Dd, for example.

In the example in which the multiplying analog-to-digital converter 100 is realized as a 1.5-bit analog-to-digital multiplier, the digital value Dd0 is 0, 1 and 2. In other words, the minimum Dd0_min and the maximum Dd0_max of the digital value Dd0 are respectively equal to digital value 0 and digital value 2. The minimum Dd0_min and the maximum Dd0_max may be denoted as binary numbers $(00)_2$ and $(11)_2$ according to the thermometer code. In the present example, the value of the digital value Dd0 is denoted according to the thermometer code. That is, the range of the value of the digital value Dd0 can be denoted as $(00)_2$, $(01)_2$ and $(11)_2$.

The multiplying analog-to-digital converter 100 includes a sample-and-hold unit 10, an analog-to-digital converting unit 20, a digital-to-analog converting unit 30 and an operating unit 40. The sample-and-hold unit 10, controlled by the clock signal clk, samples an analog signal Vin to obtain a sample level Ls. The analog-to-digital converting unit 20, controlled by the clock signal clk, converts the analog signal Vin to obtain a digital value Dd0. The digital-to-analog converting unit 30 converts the digital value Dd0 to obtain a recovered signal level Lf. The operating unit 40 generates an output signal Vo according to the difference between the sample level Ls and the recovered signal level Lf.

For example, the operating unit 40 of the present embodiment includes a subtractor 41 and a multiplier 42 whose gain is the power of 2. The subtractor 41 subtracts the recovered signal level Lf from the sample level Ls to obtain their difference. The multiplier 42 whose gain is the power of 2 generates an output signal Vo according to the difference obtained by the subtractor 41.

Figure 3:
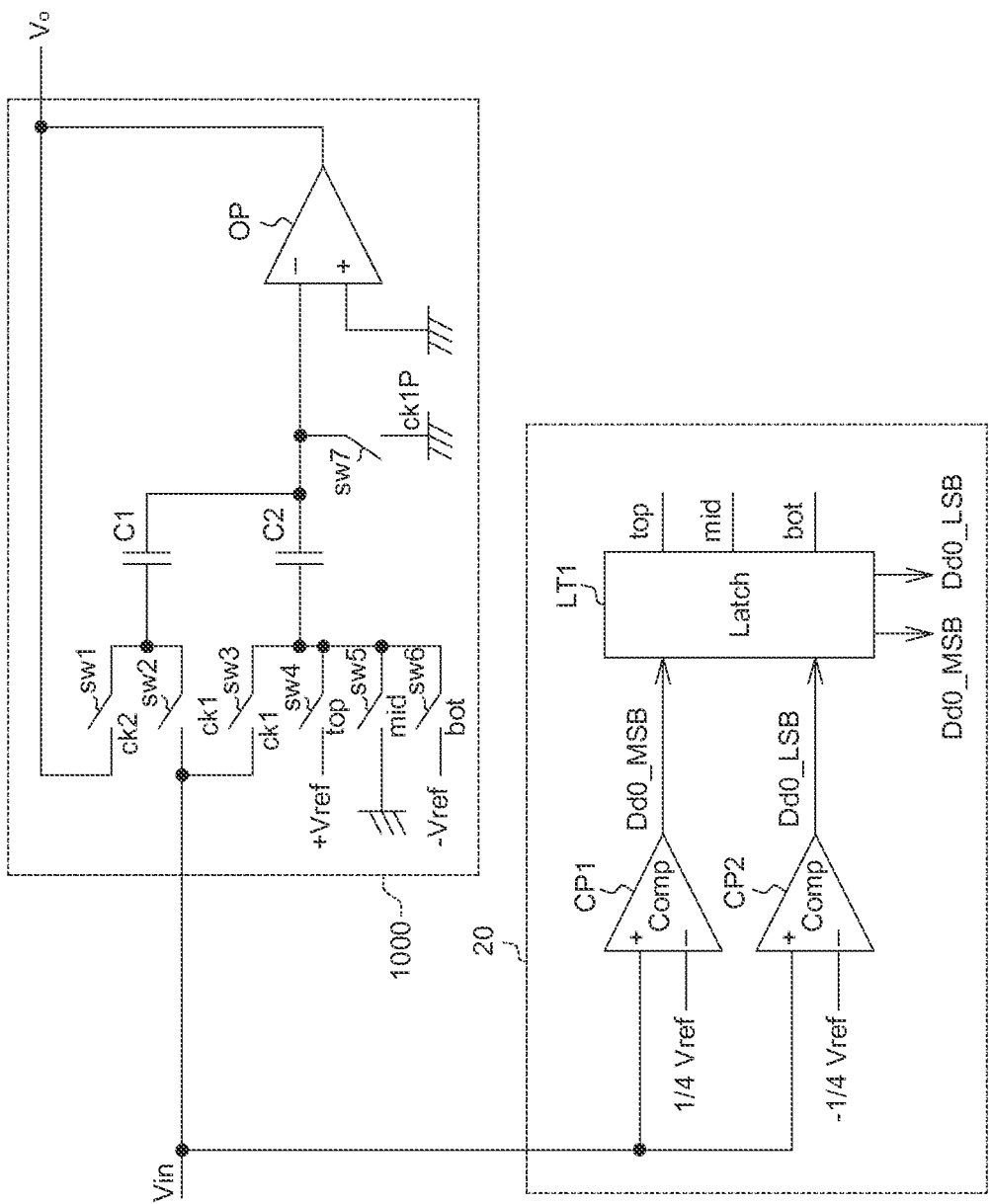
FIG. 3 shows a block diagram of a multiplying analog-to-digital converter of FIG. 2 according to an embodiment of the invention.

Referring to FIG. 3, a block diagram of a multiplying analog-to-digital converter 100 of FIG. 2 according to an embodiment of the invention is shown. The analog-to-digital converting unit 20 is realized by comparators CP1 and CP2 and a latch LT1. The comparators CP1 and CP2 respectively compare a level of the analog signal Vin with the first threshold level ¼ Vref and compare a level of the analog signal Vin with the second threshold level −¼ Vref to correspondingly determine a most significant bit (MSB) Dd0_MSB and a least significant bit (LSB) Dd0_LSB for the digital value Dd0. The latch LT1 temporarily stores the digital value Dd0, and provides enabled signals top, mid and bot when the digital value Dd0 is equal to $(00)_2$, $(01)_2$ and $(11)_2$ respectively.

The sample-and-hold unit 10, the digital-to-analog converting unit 30 and the operating unit 40 are implemented by a switch capacitor circuit 1000, which includes switches sw1-sw7, capacitors C1 and C2 and an operating amplifier OP. Furthermore, the switch sw1 is controlled by the clock signal ck2, the switches sw2 and sw3 are controlled by the clock signal ck1, the switch sw7 is controlled by the clock signal ck1 P, and the switches sw4-sw6 are controlled by the signals top, mid and bot, respectively.

Figure 4:
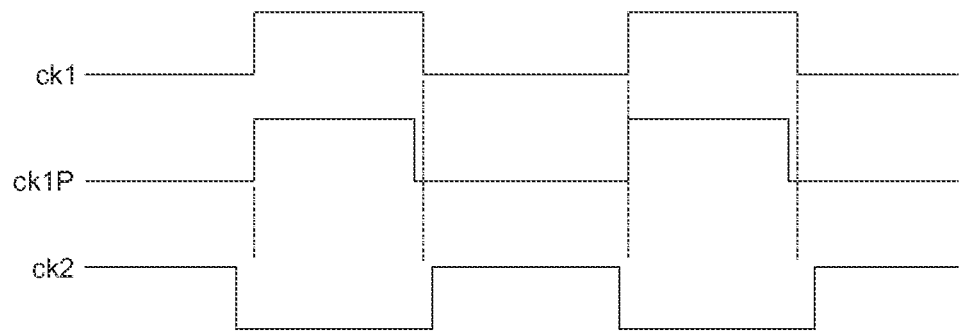
FIG. 4 shows a timing diagram of related signals of a circuit of a multiplying analog-to-digital converter of FIG. 3 according to an embodiment of the invention.

Referring to FIG. 4, a timing diagram of related signals of a circuit of a multiplying analog-to-digital converter 100 of FIG. 3 according to an embodiment of the invention is shown. For example, the waveform of the clock signal ck1P is close to that of the clock signal ck1, but the falling edge of the clock signal ck1P occurs a little earlier than the falling edge of the clock signal ck1. Through the switching operation of the switches sw1-sw3 and sw7, the analog voltage capacitors C1 and C2 are charged when the clock signals ck1 and ck1P are at high levels, so as to store the analog signal Vin across the two terminals of the analog voltage capacitors C1 and C2, and an output signal whose level is equal to 2 Vin is obtained at the output terminal of the operation amplifier OP during the period when the clock signal ck2 is at high level.

Meanwhile, one of the signals top, mid and bot is enabled during the period when the clock signal ck2 is at high level, so as to selectively provide one of the reference voltage +Vref, the ground voltage GND and the reference voltage −Vref to one terminal of the capacitor C2, such that the output signal Vo selectively corresponds to the levels 2 Vin+Vref, 2 Vin and 2 Vin−Vref.

Like the multiplying analog-to-digital converter 100, each of the post-stage multiplying analog-to-digital converters 200_1~200_N has a sample-and-hold unit, an analog-to-digital converting unit, a digital-to-analog converting unit, and an operating unit, which execute substantially the same operations like corresponding components of the multiplying analog-to-digital converter 100 to correspondingly generate digital data Dd1~DdN. The circuit structures of the post-stage multiplying analog-to-digital converters 200_1~200_N are similar to that of the multiplying analog-to-digital converter 100, and the similarities are not repeated in the present embodiment.

Referring to FIG. 1 and FIG. 2. The pipeline analog-to-digital converter 1 of the present embodiment does not use a pre-stage sample-and-hold circuit, and uses a first stage of multiplying analog-to-digital converter (that is, the multiplying analog-to-digital converter 100) to receive a to-be-converted analog signal Vin. In comparison to the conventional pipeline analog-to-digital converter, the pipeline analog-to-digital converter 1 of the present embodiment does not use the pre-stage sample-and-hold circuit, hence resolving the problems of power consumption being too high and circuit area being too large which occur due to the use of the pre-stage sample-and-hold circuit in the conventional pipeline analog-to-digital amplifier.

Figure 5:
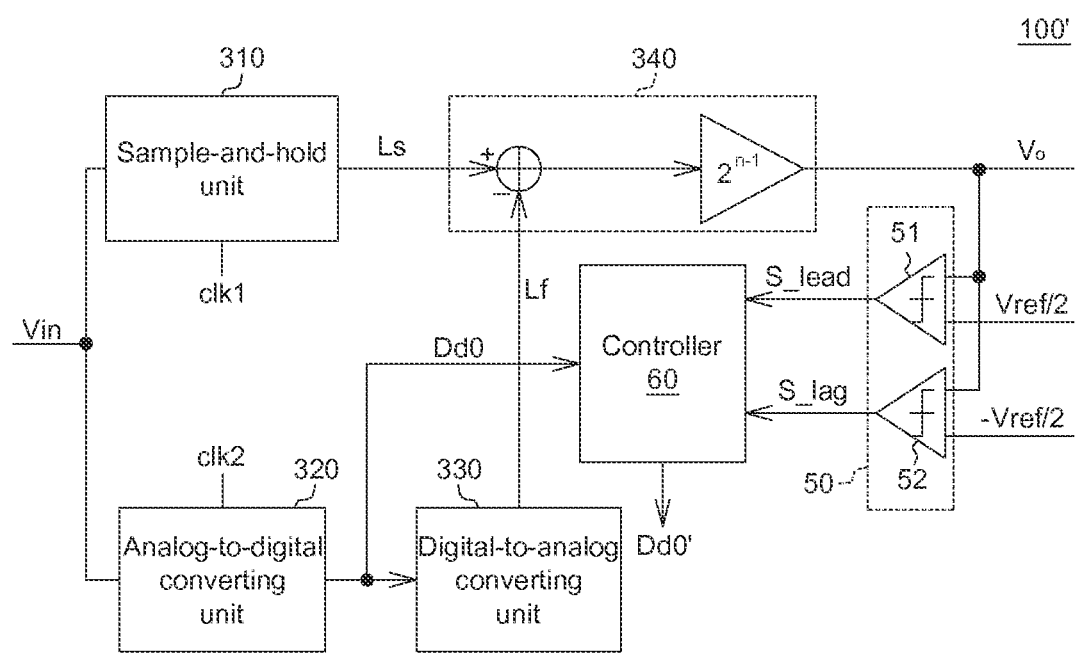
FIG. 5 shows a block diagram of a multiplying analog-to-digital converter according to a second embodiment of the invention.

Second Embodiment:

Referring to FIG. 5, a block diagram of a multiplying analog-to-digital converter according to a second embodiment of the invention is shown. The multiplying analog-to-digital converter 100' of the present embodiment is different from the multiplying analog-to-digital converter 100 of the first embodiment as illustrated in FIG. 2 mainly in that the multiplying analog-to-digital converter 100' of the present embodiment further includes a comparator 50 and a controller 60 in addition to a sample-and-hold unit 310, an analog-to-digital converting unit 320, a digital-to-analog converting unit 330 and an operating unit 340. The multiplying analog-to-digital converter 100' of the present embodiment is an improvement of the multiplying analog-to-digital converter 100 to resolve the possible errors caused by the digital value Dd0 generated by the multiplying analog-to-digital converter 100. Before the details of the multiplying analog-to-digital converter 100' of FIG. 5 are explained, the principles of the errors caused by the digital value Dd0 generated by the multiplying analog-to-digital converter 100 are explained first with accompanying drawings FIGS. 6-8.

Figure 6:
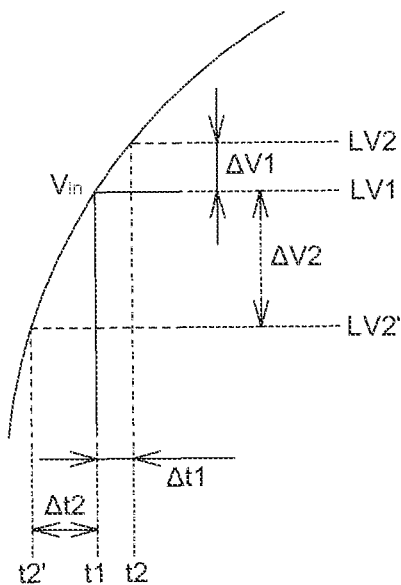
FIG. 6 shows a voltage diagram of an analog signal Vin of a multiplying analog-to-digital converter of FIG. 2 according to an embodiment of the invention.

Refer to FIG. 2 again. In the first embodiment illustrated in FIG. 2, the circuit structure of the multiplying analog-to-digital converter 100 is similar to that of the post-stage multiplying analog-to-digital converters 200_1~200_N. The pipeline analog-to-digital converter 1 does not use the pre-stage sample-and-hold circuit. When the sample-and-hold unit 10 and the analog-to-digital converting unit 20 of the multiplying analog-to-digital converter 100 execute corresponding sampling and holding operations and analog-to-digital conversion, the analog signal Vin is an analog voltage signal whose level changes continuously and the waveform of the analog signal Vin is illustrated in FIG. 6. FIG. 6 shows a voltage diagram of the analog signal Vin of a multiplying analog-to-digital converter 100 of FIG. 2 according to an embodiment of the invention.

Although the sample-and-hold unit 10 and the analog-to-digital converting unit 20 receive the same clock signal, there is a phase difference between the clock signal received by the sample-and-hold unit 10 and clock signal received by the analog-to-digital converting unit 20 due to many unexpected factors. Let the clock signal provided to the sample-and-hold unit 10 be denoted as clk1, and let the clock signal provided to the analog-to-digital converting unit 20 be denoted as clk2. There is a phase difference between the clock signal clk2 and the clock signal clk1, which respectively drive the analog-to-digital converting unit 20 to execute analog-to-digital conversion at time point t2 and drive the sample-and-hold unit 10 to execute sampling operation at time point t1.

In the example of FIG. 6, the phase of the clock signal clk2 lags behind the phase of the clock signal clk1, so that the time point t2 lags behind time point t1 by a time difference $\Delta t1$. Within the time difference $\Delta t1$, the level of the analog signal Vin changes to LV2 form LV1. Thus, the analog signal Vin (corresponding to level LV2) referred to by the analog-to-digital converting unit 20 is $\Delta V1$ higher than the analog signal Vin (corresponding to level LV1) referred to by the sample-and-hold unit 10. Thus, the recovered signal level Lf (corresponding to level LV2) obtained by the analog-to-digital converting unit 20 and the digital-to-analog converting unit 30 is shifted from the sample level Ls (corresponding to level LV1) obtained by the sample-and-hold unit 10, the level of the output signal Vo obtained according to their difference is shifted accordingly, and the conversion curve of the multiplying analog-to-digital converter 100 is affected.

Figure 7:
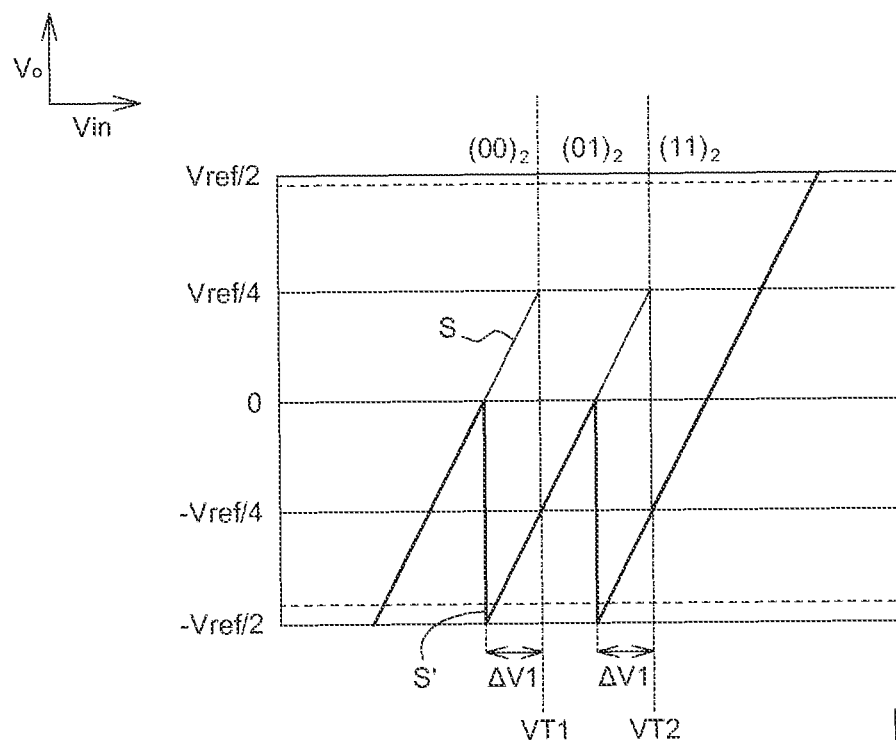
FIG. 7 shows a conversion curve and an ideal conversion curve of multiplying analog-to-digital converter of FIG. 2 in an operating example.

Referring to FIG. 7, a conversion curve and an ideal conversion curve of multiplying analog-to-digital converter 100 of FIG. 2 in an operating example is shown. Ideally, the conversion curve of the 1.5-bit multiplying analog-to-digital converter 100 has turning points when analog signal Vin equals to threshold voltages VT1 and VT2, and the digital value Dd0 of the analog signal Vin is equal to $(00)_2$, $(01)_2$ and $(11)_2$ for the analog signal Vin whose level is lower than the threshold voltage VT1, is between the threshold voltages VT1 and VT2, and is higher than the threshold voltage VT2, respectively.

Once the analog signal Vin (corresponding to level LV2) referred to by the analog-to-digital converting unit 20 is higher than the analog signal Vin (corresponding to level LV1) referred to by the sample-and-hold unit 10 by voltage difference $\Delta V1$, the multiplying analog converter 100' will have a conversion curve S' instead of an ideal conversion curve S. In comparison to the ideal conversion curve S, the conversion curve S' has a turning points when the level of the analog signal Vin is equal to the voltage VT1-$\Delta V1$ and when the level of the analog signal Vin is equal to the voltage VT2-$\Delta V1$. Consequently, the level of the output signal Vo is shifted and error will occur to the digital value Dd0 obtained through conversion.

In the ideal conversion curve S, except for the front-most part and the rear-most part, the level of the output signal Vo is between the upper threshold level Vref/4 and the lower threshold level −Vref/4. In general, as long as the level of the output signal Vo falls within the range between the upper threshold level Vref/4 and the lower threshold level −Vref/4, the error of the output signal Vo may be corrected through the built-in redundancy mechanism of the pipeline analog-to-digital converter 1. However, in the conversion curve S', the level of the output signal Vo is shifted to be outside the range between the upper threshold level Vref/4 and the lower threshold level −Vref/4 and cannot be corrected through the built-in redundancy mechanism of the pipeline analog-to-digital converter 1.

Figures 8, 9:
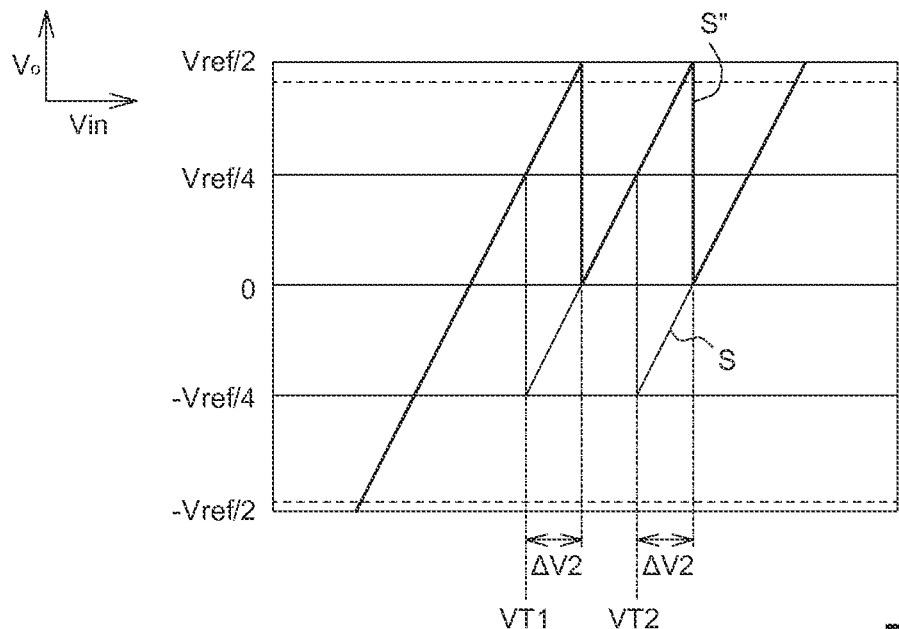
FIG. 8 shows a conversion curve and an ideal conversion curve of the multiplying analog-to-digital converter of FIG. 2 in another operating example.
FIG. 9 shows a truth table of a controller of a multiplying analog-to-digital converter of FIG. 5 according to an embodiment of the invention.

Referring to FIG. 8, a conversion curve and an ideal conversion curve of the multiplying analog-to-digital converter 100 of FIG. 2 in another operating example is shown. In this operating example, the phase of the clock signal clk2 leads the phase of the clock signal clk1, so that time point t2' leads time point t1' by a time difference $\Delta t2$. Within the time difference $\Delta t2$, the level of the analog signal Vin changes to level LV1 from level LV2'. In other words, when the phase of the clock signal clk2 leads the phase of the clock signal clk1, similar errors will occur and the multiplying analog-to-digital converter 100' will have a conversion curve S'' instead of the ideal conversion curve S.

Refer to FIG. 5. As disclosed above, the multiplying analog-to-digital converter 100' of FIG. 5 further includes a comparator 50 and a controller 60 to resolve the error caused by the digital value Dd0 as illustrated in FIGS. 6~8.

The comparator 50 compares the level of the output signal Vo with an upper threshold level (such as Vref/2) and a lower threshold level (such as −Vref/2), and provides an indicating signal representing the comparison result. The upper threshold level being Vref/2 and the lower threshold level being −Vref/2 respectively define a predetermined level range of the ideal output signal Vo. The absolute values of the upper and the lower threshold levels are the same in the present embodiment but may be different in other embodiments.

In addition, the indicating signal may include sub-indicating signals S_lead and S_lag, and the comparator 50 may include sub-comparators 51 and 52 respectively providing sub-indicating signals S_lead and S_lag. Furthermore, the sub-comparator 51 may compare the level of the output signal Vo with the upper threshold level Vref/2, and provide an enabled sub-indicating signal S_lead when the output signal Vo is substantially higher than the upper threshold level Vref/2 (that is, the phase of the clock signal clk2 received by the analog-to-digital converting unit 320 leads the phase of the clock signal clk1 received by the sample-and-hold unit 310). Likewise, the sub-comparator 52 may compare the level of the output signal Vo with the lower threshold level −Vref/2, and provide an enabled sub-indicating signal S_lag when the level of the output signal Vo is substantially lower than the lower threshold level −Vref/2 (that is, the phase of the clock signal clk2 received by the analog-to-digital converting unit lags behind the phase of the clock signal clk1 received by the sample-and-hold unit 310).

The controller 60 receives the digital value Dd0 provided by the analog-to-digital converting unit 320. The controller 60 further refers to the sub-indicating signals S_lead and S_lag to determine whether the level of the output signal Vo is inside the predetermined level range between Vref/2 and −Vref/2, and accordingly adjusts the digital value Dd0 to provide an adjusted digital value Dd0'.

When the indicating signal indicates that the level of the output signal Vo is substantially inside the predetermined level range between Vref/2 and −Vref/2, the controller 60 does not adjust the digital value Dd0. In other words, the digital value Dd0' is substantially the same with the digital value Dd0.

Conversely, when the indicating signal indicates that the level of the output signal Vo is substantially outside the range between Vref/2 and −Vref/2, the controller 60 adjusts the digital value Dd0 to provide an adjusted digital value Dd0'. Furthermore, when the enabled sub-indicating signal S_lead (that is, the level of the output signal Vo is substantially higher than the upper level Vref/2) is received, and the digital value Dd0 is smaller than the maximum (that is, $(11)_2$), the controller 60 adds a predetermined value to the digital value Dd0, and accordingly provides a digital value Dd0'. When an enabled indicating signal S_lag (that is, the level of the output signal Vo is substantially lower than the lower threshold level −Vref/2) is received, and the digital value Dd0 is larger than the minimum (that is, $(00)_2$), the controller 60 subtracts the predetermined value from the digital value Dd0, and accordingly provides a digital value Dd0'. The predetermined value is such as 1.

To summarize, through the operations of the comparator 50 and the controller 60, the multiplying analog-to-digital converter 100' may obtain the information about the state of phase shift between the clock signal clk2 received by the analog-to-digital converting unit 320 and the clock signal clk1 received by the sample-and-hold unit 310 with reference to the level shifting of the output signal Vo, and accordingly adjusts the digital value Dd0 to obtain a correct digital value Dd0'.

Figure 10:
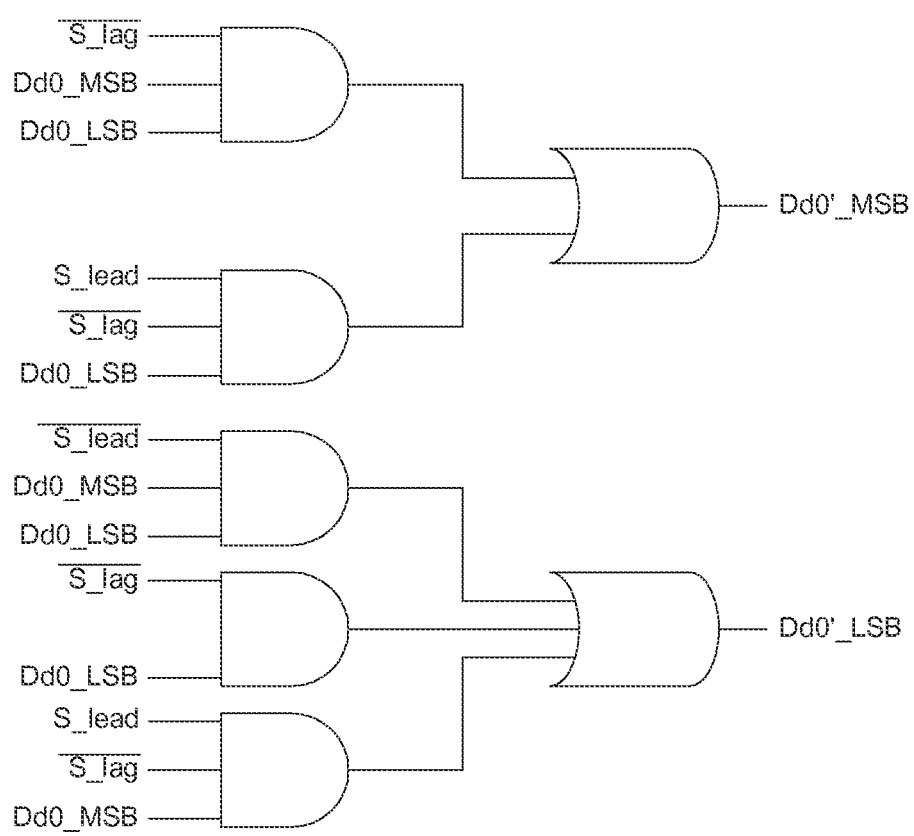
FIG. 10 shows a circuit diagram of a logic circuit of a multiplying analog-to-digital converter of FIG. 5 according to an embodiment of the invention.

In an operating example, the controller 60 may be realized by a combination of logic circuits. In an example in which the multiplying analog-to-digital converter 100' is a 1.5-bit analog-to-digital converter, the truth table and the logic circuit of the controller 60 are respectively illustrated in FIG. 9 and FIG. 10, and the most and the least significant bits Dd0'_MSB and Dd0'_LSB of the digital value Dd0' may respectively be expressed according to the following logic operation formulas:

$$Dd0'\_MSB = \overline{S\_lag} \times Dd0\_MSB \times Dd0\_LSB + S\_lead \times \overline{S\_lag} \times Dd0\_LSB$$

$$Dd0'\_LSB = \overline{S\_lead} \times Dd0\_MSB \times Dd0\_LSB + \overline{S\_lag} \times Dd0\_LSB + S\_lead \times \overline{S\_lag} \times Dd0\_MSB$$

Figure 11:
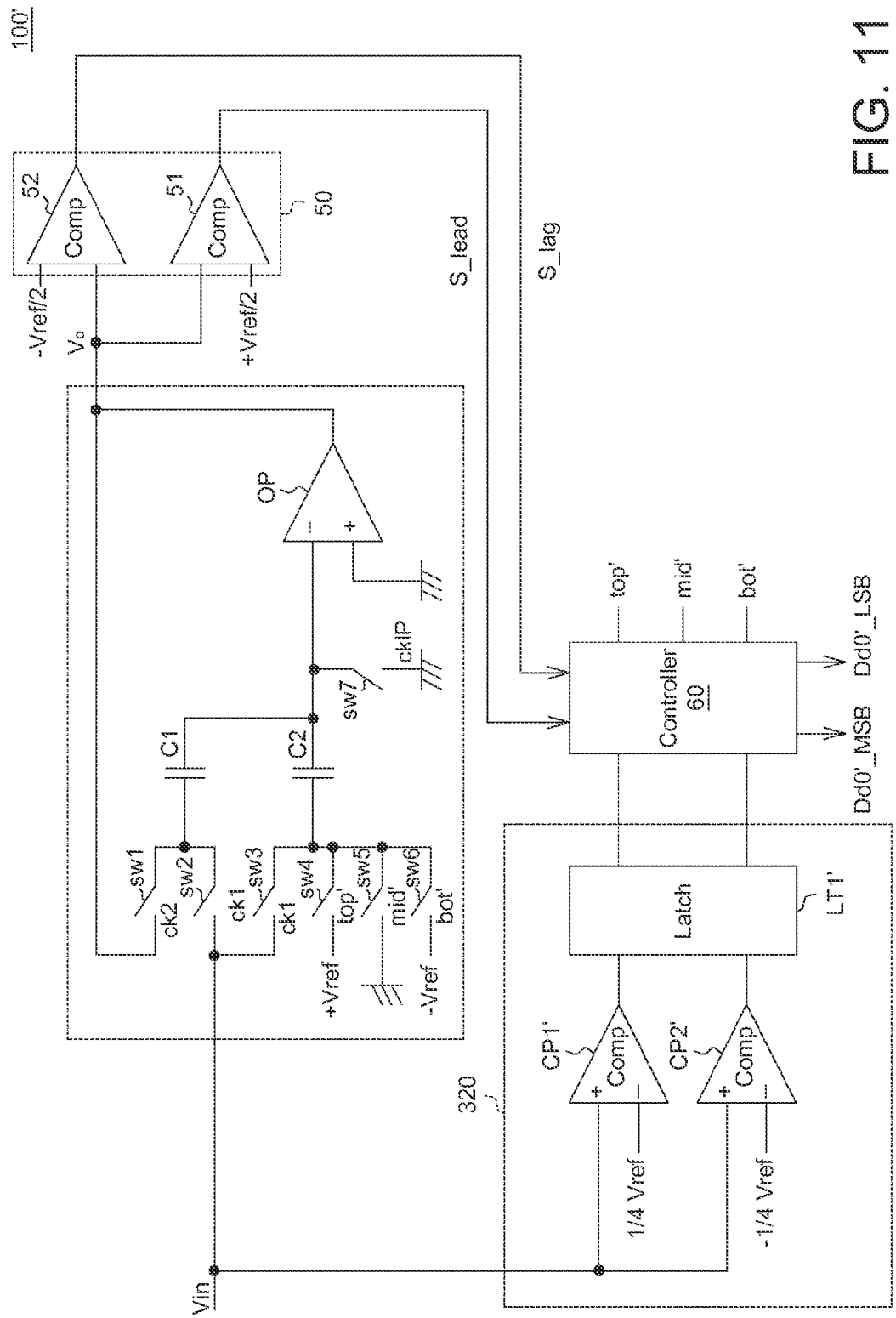
FIG. 11 shows a circuit of a multiplying analog-to-digital converter of FIG. 5 according to an embodiment of the invention.

Referring to FIG. 11, a circuit of a multiplying analog-to-digital converter 100' of FIG. 5 according to an embodiment of the invention is shown. As disclosed in related descriptions of FIG. 5, the multiplying analog-to-digital converter 100' of the present embodiment is different from the multiplying analog-to-digital converter 100 of FIG. 2 in that the multiplying analog-to-digital converter 100' further includes a comparator 50 and a controller 60, respectively comparing the output signal Vo to obtain sub-indicating signals S_lead and S_lag and obtaining the digital values Dd0'_MSB and Dd0'_LSB according to the sub-indicating signals S_lead and S_lag and the digital values Dd0_MSB and Dd0_LSB.

When the controller 60 adjusts the digital value Dd0', the original signals top, mid and bot are correspondingly corrected. The controller 60 further provides adjusted signals top', mid' and bot' respectively enabled when the digital value Dd0' is equal to $(00)_2$, $(01)_2$ and $(11)_2$ respectively. Other details of FIG. 11 can be refer to the description of FIG. 3, and are not repeated here.

Figure 12:
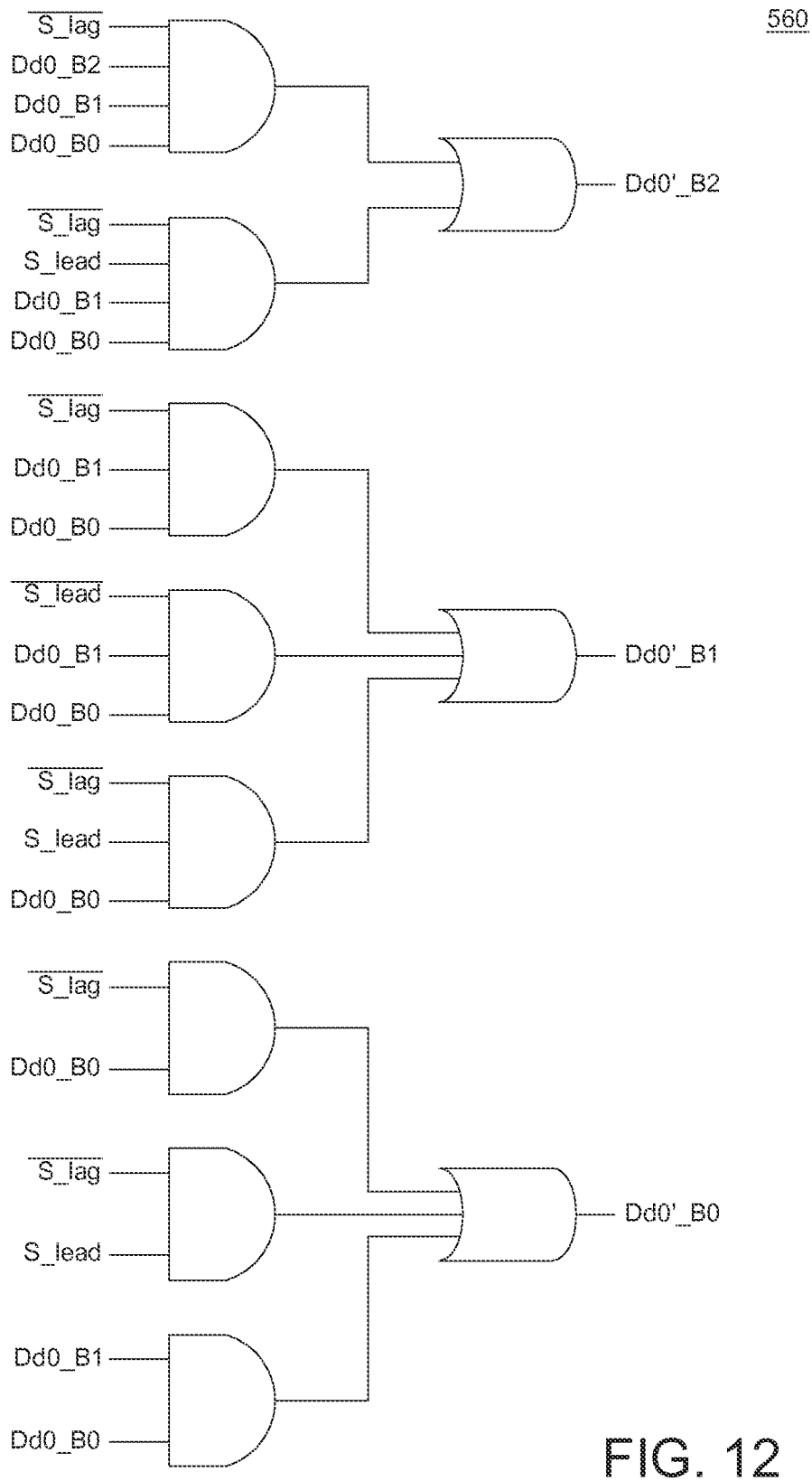
FIG. 12 shows a block diagram of the logic circuit of the controller in the multiplying analog-to-digital converter of FIG. 5 according to another embodiment of the invention.

In the first and the second embodiments of the invention, the multiplying analog-to-digital converters 100 and 100' are respectively exemplified by a 1.5-bit analog-to-digital converter, but the multiplying analog-to-digital converter of the present embodiment is not limited thereto. In other examples, the multiplying analog-to-digital converter of the present embodiment may have other number of bits. In another embodiment, the multiplying analog-to-digital converter may be realized by a 2.5-bit analog-to-digital converter, and the logic circuit structure of the corresponding controller 560 is shown in FIG. 12, for example. The logic circuit structure and truth table of the controller having other number of bits may be obtained in the same manner.

It is noted that the circuit design of the pipeline analog-to-digital converter 1 of FIG. 1 does not use the pre-stage sample-and-hold circuit. However, the pipeline analog-to-digital converter is not limited thereto. In other embodiments, the pipeline analog-to-digital converter with the pre-stage sample-and-hold circuit may adopt the circuit design of the multiplying analog-to-digital converter disclosed in above embodiments of the invention.

In the above embodiments, by using the comparator and the controller, the multiplying analog-to-digital converter can adjust the digital value outputted by the analog-to-digital converting unit with reference to the level shifting of the output signal so as to reduce the errors in the digital value. Furthermore, according to the requirement of design, the pipeline analog-to-digital converter using the multiplying analog-to-digital converter disclosed above may not further use the pre-stage sample-and-hold circuit to resolve the problems of power consumption being too high and circuit area being too large.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multiplying analog-to-digital converter, comprising:
    a sample-and-hold unit, for sampling an analog signal to obtain a sample level;
    an analog-to-digital converting unit, for converting the analog signal to obtain a digital signal, wherein the level range of the digital signal is between a minimum and a maximum;
    a digital-to-analog converting unit, for converting the digital signal to obtain a recovered signal level;
    an operating unit, for providing an output signal according to the difference between the sample level and the recovered signal level;

a comparator, for comparing the level of the output signal with an upper threshold level and a lower threshold level and accordingly providing an indicating signal representing the comparison result, wherein the upper threshold level and the lower threshold level define a predetermined level range; and a controller, for shifting a value of the digital signal and accordingly providing an adjusted digital signal when the indicating signal indicates that the level of the output signal is outside the predetermined level range.

2. The multiplying analog-to-digital converter according to claim 1, wherein the operating unit comprises:
a subtractor, for subtracting the recovered signal level from the sample level; and
an operation amplifier, for generating the output signal according to the subtraction result of the subtractor.

3. The multiplying analog-to-digital converter according to claim 1, wherein
the controller adds a predetermined value to the value of the digital signal when the indicating signal indicates that the level of the output signal is substantially higher than the upper threshold level and the digital signal is smaller than the maximum.

4. The multiplying analog-to-digital converter according to claim 1, wherein the controller subtracts a predetermined value from the value of the digital signal when the indicating signal indicates that the level of the output signal is substantially lower than the lower threshold level and the digital signal is larger than the minimum.

5. The multiplying analog-to-digital converter according to claim 1, wherein the indicating signal comprises a first sub-indicating signal and a second sub-indicating signal, and the comparator comprises:
a first sub-comparator, for comparing the level of the output signal and the upper threshold level, and providing an enabled first sub-indicating signal indicating that the output signal is substantially higher than the upper threshold level; and
a second sub-comparator, for comparing the level of the output signal and the lower threshold level and providing an enabled second sub-indicating signal when the output signal is substantially lower than the lower threshold level.

6. The multiplying analog-to-digital converter according to claim 1, wherein the sample-and-hold unit, the digital-to-analog converting unit and the operating unit are implemented by a switch capacitor circuit.

7. A multiplying analog-to-digital converter, comprising:
an analog-to-digital converting unit, converting an analog signal to obtain a digital signal, wherein the level range of the digital signal is between a minimum and a maximum;
a switch capacitor circuit, for providing an output signal according to the analog signal and the digital signal;
a comparator, for comparing the level of the output signal with an upper threshold level and a lower threshold level, and providing an indicating signal representing the comparison result, wherein the upper threshold level and the lower threshold level define a predetermined level range; and
a controller, for shifting a value of the digital signal and accordingly provides an adjusted digital signal when the indicating signal indicates that the level of the output signal is outside the predetermined level range.

8. The multiplying analog-to-digital converter according to claim 7, wherein the switch capacitor circuit comprises:

one or more switches coupled to the analog signal, wherein at least one of the switches is used for switching according to the digital signal;
one or more capacitors coupled to the one or more switches; and
an operation amplifier, comprising an input node and an output node, wherein the input node is coupled to the one or more capacitors and the output node generates the output signal.

9. The multiplying analog-to-digital converter according to claim 7, wherein
the controller adds a predetermined value to the value of the digital signal when the indicating signal indicates that the level of the output signal is substantially higher than the upper threshold level and the digital signal is smaller than the maximum.

10. The multiplying analog-to-digital converter according to claim 7, wherein the controller subtracts a predetermined value from the value of the digital signal when the indicating signal indicates that the level of the output signal is substantially lower than the lower threshold level and the digital signal is larger than the minimum.

11. The multiplying analog-to-digital converter according to claim 7, wherein the indicating signal comprises a first sub-indicating signal and a second sub-indicating signal, and the comparator comprises:
a first sub-comparator, for comparing the level of the output signal and the upper threshold level and providing an enabled first sub-indicating signal when the output signal is substantially higher than the upper threshold level; and
a second sub-comparator, for comparing the output signal and the lower threshold level and providing an enabled second sub-indicating signal when the output signal is substantially lower than the lower threshold level.

12. A pipeline analog-to-digital converter, comprising:
the multiplying analog-to-digital converter according to claim 1; and
one or more post-stage multiplying analog-to-digital converters providing a second digital signal according to the output signal.

13. A pipeline analog-to-digital converter, comprising:
the multiplying analog-to-digital converter according to claim 7; and
one or more post-stage multiplying analog-to-digital converters providing a second digital signal according to the output signal.

14. A multiplying analog-to-digital converter, comprising:
a sample-and-hold unit, for sampling an analog signal to obtain a sample level;
an analog-to-digital converting unit, for converting an analog signal to obtain a digital signal;
a digital-to-analog converting unit, for converting the digital signal to obtain a recovered signal level; and
an adjusting circuit, configured to adjust the digital signal according to a difference between the sample level and the recovered signal level.

15. The multiplying analog-to-digital converter according to claim 14, wherein the adjusting circuit judges whether the difference is within a predetermined range and adjusts the digital signal according to a result of the judgment.

16. The multiplying analog-to-digital converter according to claim 15, wherein the adjusting circuit comprises:
an operating unit, for providing an output signal according to the difference between the sample level and the recovered signal level;

a comparator, for comparing the level of the output signal with a plurality of threshold levels corresponding to the predetermined rage; and a controller, for adjusting the digital signal according to a result of the comparison.

17. A multiplying analog-to-digital converter, comprising:

an analog-to-digital converting unit, converting an analog signal to obtain a digital signal;

a switch capacitor circuit, for providing an output signal according to the analog signal and the digital signal; and an adjusting circuit, configured to adjust the digital signal according to a level of the output signal.

18. The multiplying analog-to-digital converter according to claim 17, wherein the adjusting circuit judges whether the level of the output signal falls in a predetermined level range and adjusts the digital signal according to a result of the judgment.

19. The multiplying analog-to-digital converter according to claim 18, wherein the adjusting circuit comprises:

a comparator, for comparing the level of the output signal with a plurality of threshold levels for defining the predetermined level range; and a controller, for adjusting the digital signal according to a result of the comparison.

* * * * *